United States Patent [19]

Nakaizumi et al.

[11] 4,059,783

[45] Nov. 22, 1977

[54] FIELD EMISSION APPARATUS

[75] Inventors: Yasushi Nakaizumi; Yukichi Ueno, both of Katsuta; Masahide Okumura, Hachioji, all of Japan

[73] Assignee: Hitachi, Ltd., Japan

[21] Appl. No.: 758,794

[22] Filed: Jan. 12, 1977

[30] Foreign Application Priority Data

Jan. 21, 1976 Japan .................................. 51-5733

[51] Int. Cl.² .................... H05B 41/36; H02H 7/20
[52] U.S. Cl. .......................................... 315/107; 328/9
[58] Field of Search ...................... 315/107, 106; 328/9

[56] References Cited

U.S. PATENT DOCUMENTS

| 3,887,835 | 6/1975 | Nomura | 315/94 |
| 3,936,756 | 2/1976 | Someya et al. | 328/9 |

Primary Examiner—Alfred E. Smith
Assistant Examiner—Charles F. Roberts
Attorney, Agent, or Firm—Craig & Antonelli

[57] ABSTRACT

An electron producing apparatus of the field emission type wherein instantaneous values of an emitted current are sequentially measured to store a relative minimum value of the emitted current which is obtained in such a manner that one instantaneous value which is stored is then replaced by another instantaneous value which is even smaller in magnitude than the previously stored one, and at the same time the instantaneous values are sequentially compared with the stored relative minimum value so that the electron producing apparatus is deenergized when an instantaneous value assumes a certain magnitude relative to the stored relative minimum value.

10 Claims, 3 Drawing Figures

FIELD EMISSION APPARATUS

BACKGROUND OF THE INVENTION

1. FIELD OF THE INVENTION

This invention relates to an electron producing apparatus and more particularly to an electron producing apparatus of the field emission type.

2. DESCRIPTION OF THE PRIOR ART

In an electron producing apparatus using field emission phenomenon, the current due to field emission, when produced through the application of a high voltage to the field emission electron source with its electron emission surface cleaned, for example, by heating, first varies in an initial unstable region wherein the field emittion current steeply decreases and then reaches a first stable region wherein the current first assumes a substantial constant value without any appreciable decrease and then gradually increases. After the stable region, the emitted electron current enters a second unstable region wherein it increases while fluctuating. Thereafter, the current further increases with greater fluctuations and the further continuation of field emission will damage the field emission source by severe discharge. For this reason, it is necessary to interrupt the field emission as soon as the later unstable region has been reached and to re-clean the field emission source by heating for example. The current due to field emission, when resumed after the cleaning, will undergo almost the same change with time. Conventionally, it was the operator who manually interrupted the field emission and cleaned the emission source through the monitor of the emitted current. In this case, however, there was a drawback, i.e. a possibility that the field emission source might be injured due to the operator's carelessness.

An electron producing apparatus of the field emission type, provided with a control means for eliminating such a drawback as mentioned above is disclosed in Japanese Pat. application No. 93,993/45, entitled "FIELD EMISSION APPARATUS" and filed Oct. 27, 1970, the subject matter of which was invented by T. NAGATANI and then the right to obtain a patent thereto was assigned to the common assignee to the present application. The Japanese Pat. application No. 93,993/45 has been registered as Japanese Pat. No. 719,194 under the date of Feb. 19, 1974. The electron producing apparatus of the field emission type disclosed in the specification of the Japanese Pat. No. 719,194 is provided with a control means by which instantaneous values of the electron current emitted from a field emission electron source or an electron gun are sequentially measured and the field emission source or the electron gun is deenergized so as to interrupt the emission of electrons when an instantaneous value of the current at a certain point of time assumes a predetermined magnitude relative to an instantaneous value previously measured at the moment when a predetermined time has lapsed after the initiation of the electron emission by the electron gun. However, the mode of change with time in the current due to the field of emission of electrons is not unique but varies largely depending on the degree of vacuum around the electron gun, the sort or amount of the residual gas and the magnitude of the emitted electron current. The time period from the initiation of the field emission to the end of the later or second unstable region, ranges from a few minutes to several tens of hours. The control means therefore has a drawback, i.e. practical inconvenience, that the above-mentioned predetermined time must be set anew each time the degree of vacuum, the quantity or sort of the residual gas, or the magnitude of the current due to the electron emission is changed for some reason.

SUMMARY OF THE INVENTION

One object of this invention is to provide an electron producing apparatus of the field emission type which is free from the above drawback.

Another object of this invention is to provide an electron producing apparatus of the field emission type having a means for preventing the damage to the field emission electron source.

Yet another object of this invention is to provide an electron producing apparatus of the field emission type having a means for automatically preventing the damage to the field emission electron source.

A further object of this invention is to provide an electron producing apparatus of the field emission type having a means for automatically preventing the damage to the field emission electron source no matter what change the current due to the field emission of electrons may undergo with time.

According to this invention, which has been made to attain the above objects, there is provided an electron producing apparatus of the field emission type wherein instantaneous values of an emitted current are sequentially measured to store a relative minimum value of the emitted current which is obtained in such a manner that one instantaneous value which is stored is then replaced by another instantaneous value which is even smaller in magnitude than the previously stored one, and at the same time the instantaneous values are sequentially compared with the stored relative minimum value so that the electron producing apparatus is deenergized when an instantaneous value assumes a certain magnitude relative to the stored relative minimum value.

The above objects and features and other objects, features and advantages of this invention will be apparent when one reads the following description of this invention in connection with the attached drawings.

DESCRIPTION OF THE PREFERRED EMBODIMENTS

This invention will now be described in detail by way of embodiment.

Figure 1:
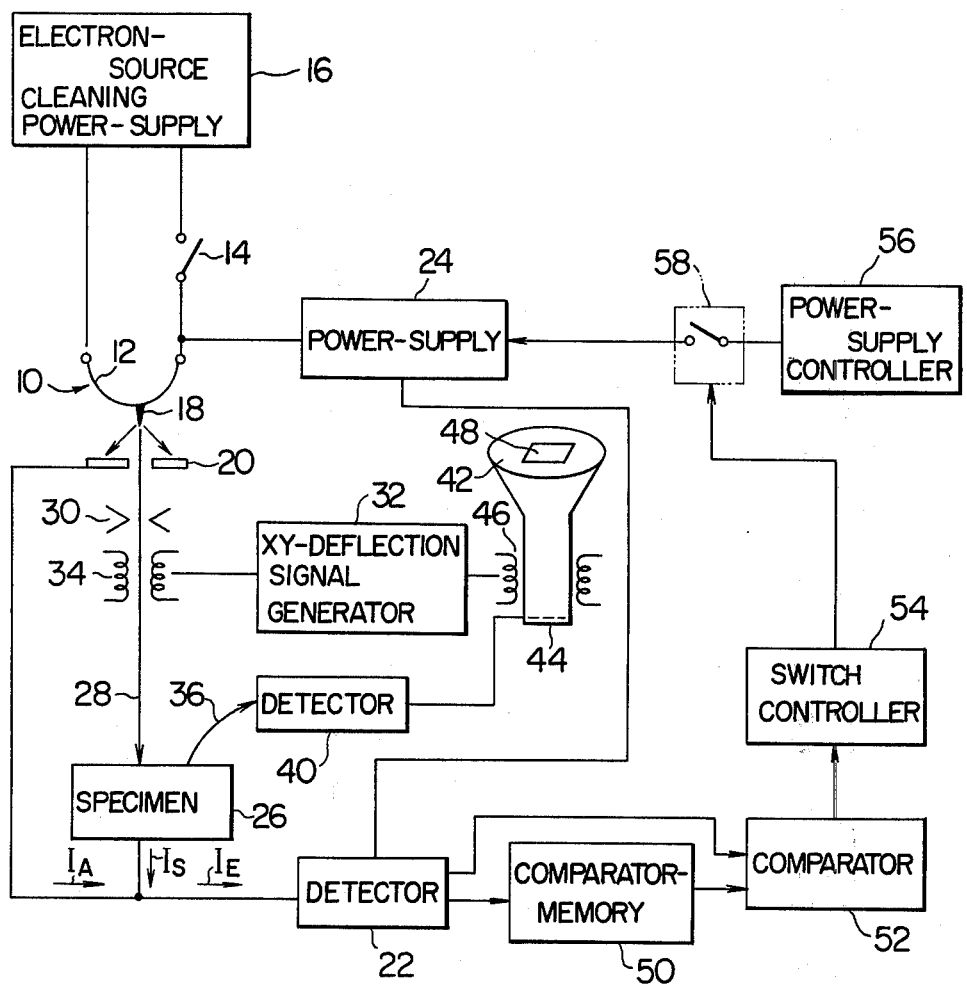
FIG. 1 is a block diagram of an embodiment of an electron producing apparatus of the field emission type according to this invention.

FIG. 1 shows an electron producing apparatus of the field emission type as an preferred embodiment of this invention, applied to a scanning electron microscope. An electron source consists of a filament 12 and a field emitting tip 18 supported by the filament 12. The filament 12 is connected to an electron source cleaning power supply 16 through a switch 14. An anode 20 is disposed opposite to the tip 18, and between the anode 20 and the filament 12 is connected a high voltage power supply 24 through a detector 22 for measuring the field emission electron current. The electron current is partially absorbed by the anode 20 and partially passes through the opening of the anode 20 to serve as an electron beam 28 which is cast upon a specimen 26. The sum of the electron current $I_A$ flowing through the anode 20 and the electron current $I_S$ flowing through the specimen flows as a total emission electron current $I_E$ into the detector 22. The electron current which has past the opening of the anode 20 is converged into the electron beam 28 by means of a condenser lens 30. The electron beam 28 is deflected by a deflection system 34 controlled by an XY-deflection signal generator or sweep generator 32 so that it scans over the specimen 26. The secondary electrons 36 emitted from the specimen 26 as a result of the scanning by the electron beam 28 are detected by a detector 40, the output of which is applied to a grid 44 of a cathode ray tube 42. An electron beam in the cathode ray tube 42 is deflected by a deflection system 46. The deflecting system 46 is connected with the XY-deflection signal generator 32 to be kept in synchronism with the deflection system 34. The scanning over the specimen 26 by the electron beam 28 is therefore synchronized with the scanning over a display surface 48 of the cathode ray tube 42 so that a figure having the same outline as the specimen is displayed on the display surface 48.

The detector 22 is connected with a comparator-memory 50, which temporarily stores an instantaneous value of the total field emission electron current $I_E$ and compares the stored value with the next applied instantaneous value so that if the latter is smaller than the former, the content of the memory, i.e. the stored value, is replaced by the next applied value. On the contrary, if the newly applied instantaneous value is larger than the value, the content of the memory is left as it is. In this way, the stored value is always compared with the successively arriving instantaneous values, whereby a relative minimum value of the total emission current $I_E$ is temporarily stored in the comparator-memory 50. A comparator 52 is connected with the comparator-memory 50 and the comparator 52 receives as an input the temporarily stored relative minimum value of the total emission current $I_E$ which is expected to be renewed. The comparator 52 also sequentially receives the instantaneous values detected by the detector 22 and delivers an output when an instantaneous value under detection assumes a predetermined magnitude relative to the relative minimum value stored in the comparator-memory 50. A switch controller 54 is connected with the comparator 52 which operates in response to the output of the comparator 52 and opens a switch 58 connected between the high voltage power supply 24 and a high voltage power supply controller 56.

The electron producing apparatus of the field emission type according to an embodiment of this invention has such a structure as described above and can be applied to, for example, a scanning electron microscope as above.

Figure 2:
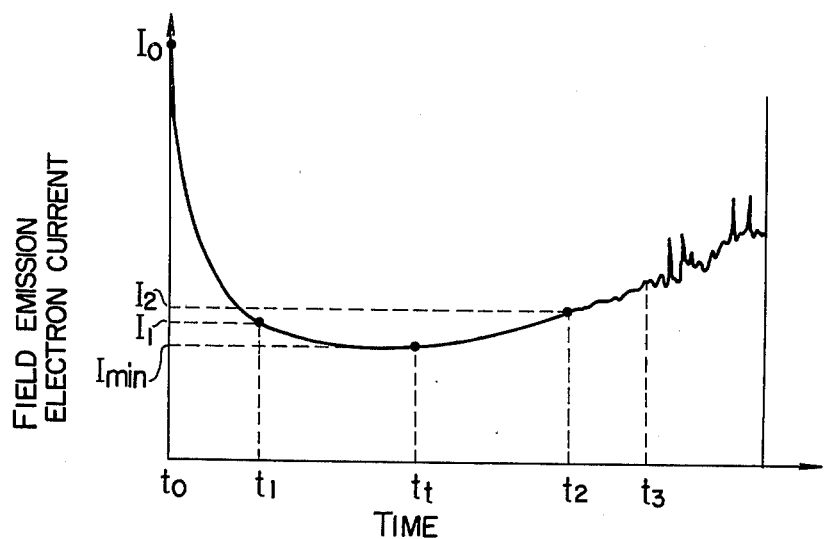
FIG. 2 shows in graphical representation the change with time in the current due to the field emission of electrons.

Next, the operation of the apparatus as a preferred embodiment of this invention shown in FIG. 1 will be described in detail. When the switch 14 is closed, the field emission electron source 10 is heated to be cleaned. After the source 10 has been cleaned, the switch 14 is opened. The switch 58 is then closed so that the high voltage power supply 24 is controlled by the high voltage power supply controller 56. As a result, a high voltage is applied to the field emission electron source 10, which in turn emits an electron current. The electron current usually undergoes the change with time as shown in FIG. 2. For the better understanding of this invention, the change with time in the electron current will be detailed with reference to FIG. 2.

As seen in FIG. 2, the field emission electron current steeply decreases from $I_o$ at instant $t_o$ after the cleaning of the field emission electron source 10 to $I_1$ at instant $t_1$. The region where the current steeply decreases from $I_o$ to $I_1$ is said to be the so-called initial unstable region. The electron current almost ceases to decrease and is kept roughly constant for a while after the instant $t_1$. Thereafter, the electron current gradually increases up to $I_2$ at instant $t_2$. The period from $t_1$ to $t_2$ is called the stable region, where the stable operation of the electron producing apparatus of the field emission type is assured. After the instant $t_2$, the electron current increases with small fluctuations toward $t_3$. This period of time from $t_2$ to $t_3$ is called the later unstable region. Past the instant $t_3$, the tip 18 of the field emission electron source 10 will be injured due to the discharge taking place from $t_3$ forward. Therefore, it is necessary to interrupt the field emission of electrons after the instant $t_2$ and to resume the field emission after the cleaning of the electron source 10 has been effected by, for example, heating. The electron current due to the field emission thus resumed will exhibit almost the same mode of change with time as described above. Conventionally, an operator manually interrupted the field emission of electrons and cleaned the field emission electron source 10 through monitoring the field emission electron current. However, such a manual operation cannot be free from a drawback as described above. This invention is intended to eliminate such a drawback and therefore to automatize the operation of the interruption and the cleaning. The value of the electron current in the later unstable region is about 1.2 to 2.0 times larger than the minimum value $I_{min}$ of the electron current in the stable region. It is preferable to interrupt the field emission when the electron current enters the range of 1.2 – 2.0 $\times$ $I_{min}$ and to clean the source 10. It is less economical to interrupt the field emission when the electron current is below the range while there is the danger of the tip 18 being damaged if the field emission is continued until the electron current rises above the range. It has been empirically revealed that it is the most preferable to interrupt the field emission to clean the field emission electron source when the electron current has reached a value of about 1.5 $\times$ $I_{min}$. In the embodiment shown in FIG. 1, the total field emission electron current $I_E$ is detected to detect the electron current under consideration. The current $I_S$ through the specimen is negligibly small in comparison with the anode current $I_A$ and therefore the anode current $I_A$ may be regarded as approximately representing the total current $I_E$. According to an experiment, $I_A$ was measured to be in the order of $10^{-5}$ ampere and $I_S$ in the order of $10^{-9} - 10^{-10}$ ampere.

As seen in FIG. 1, the instantaneous values of the total field emission current $I_E$, which is the sum of the specimen current $I_S$ and the anode current $I_A$ and which varies with time, is detected by the detector 22. The instantaneous values of the total current $I_E$ is received as input by the comparator-memory 50. The initial instantaneous value is temporarily stored in the comparator-memory 50 and this stored value is compared with the next instantaneous value arriving next instant at the comparator-memory 50. When the next instantaneous value is smaller than the stored value, the stored value is deleted so that the later instantaneous value may be stored anew as a relative minimum value. In like manner, the stored value is sequentially compared with instantaneous values sequentially applied to the comparator-memory 50 and whenever an instantaneous value which is smaller than the stored value is received by the comparator-memory 50, the content of the store is renewed. Thus, the minimum value $I_{min}$ of the total electron current $I_E$ may be stored at the instant $t_l$. The total electron current $I_E$ increases gradually past the instant $t_l$. The instantaneous values of the total electron current $I_E$ and the minimum value $I_{min}$ stored temporarily in the comparator-memory 50 are sequentially compared with each other by the comparator 52 connected with the comparator-memory 50 past the instant $t_l$. When an instantaneous value at a certain instant $t_l$ assumes a predetermined magnitude with respect to the minimum value $I_{min}$, for example when it reaches a value within a range of about 1.2 - 2.0 times $I_{min}$ or preferably $1.5 \times I_{min}$, the comparator 52 instantly delivers an output. The output of the comparator 52 drives the switch controller 54, which in turn opens the switch 58 so that the energization of the high voltage power supply 24 by the high voltage power supply controller 56 is interrupted. Consequently, the high voltage power supply 24 stops supplying a high voltage for the field emission electron source 10. Then, the switch 14 is closed to clean the field emission electron source 10 by the electron source cleaning power supply 16. Upon the completion of the cleaning of the electron source 10, the switch 14 is opened and then the switch 58 is closed to resume the stable field emission of electrons. It is, of course, necessary to reset the comparator-memory 50 before the field emission is resumed following the closure of the switch 58. The reset of the comparator-memory 50 may be performed by using a signal produced when the high voltage power supply controller 56 actuates the high voltage power supply 24, or when the switch 58 is opened or closed, or when the switch 14 is closed or opened.

The comparator-memory 50 may be constituted of conventional circuit elements by an ordinarily skilled person in the art or may be of a conventional type. An example of the comparator-memory 50 is shown in FIG. 3.

Figure 3:
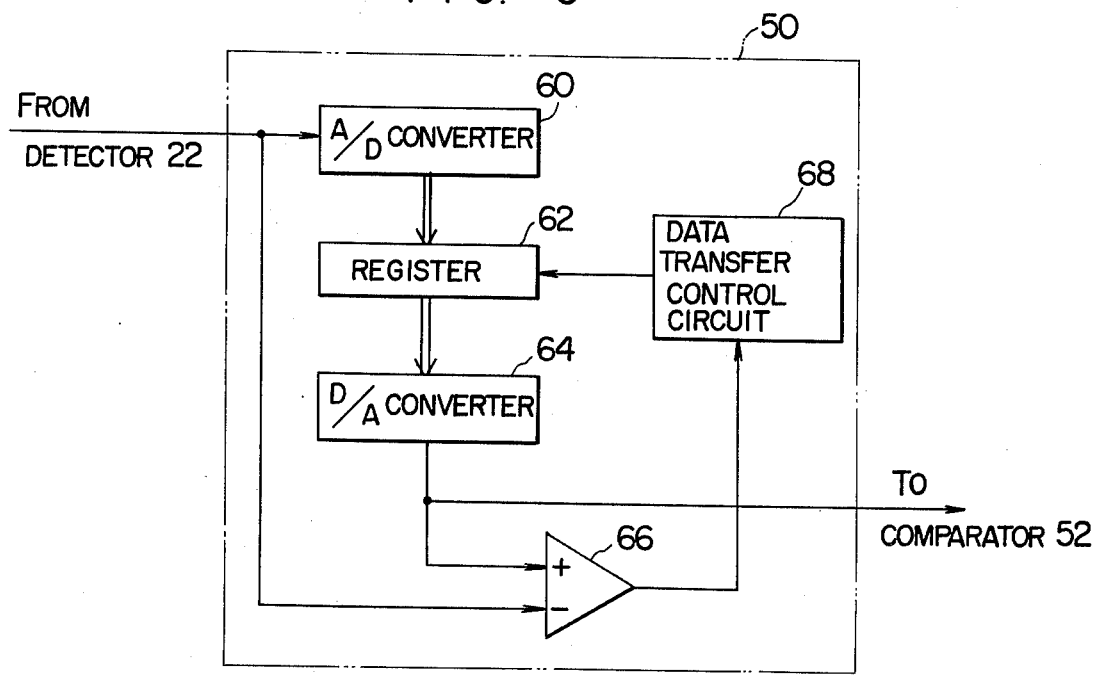
FIG. 3 shows an example of the structure of the comparator-memory used in the apparatus shown in FIG. 1.

As shown in FIG. 3, the comparator-memory 50 includes an A/D converter 60, a register 62, a D/A converter 64, a comparator 66 and a circuit 68 for controlling data transfer, all of which themselves are well-known.

The total field emission electron $I_E$ detected by the detector 22 is applied to the A/D converter 60 and then sampled with a suitable sampling period so as to be converted into digital quantities by the A/D converter 60.

The thus sampled and A/D converted instantaneous values of the total field emission electon current $I_E$ are then sequentially applied to the register 62. Assume now an instantaneous value $S_1$ at a certain instant is converted by the A/D converter 60 into a digital quantity and the digital quantity is stored in the register 62. The digital quantity stored in the register 62 is then converted by the D/A converter 64 into an analog quantity which is the instantaneous value $S_1$ and the analog quantity $S_1$ is applied to one of the two inputs of the comparator 66. An instantaneous value $S_2$ sent from the detector 22 at the next instant is also applied to the other input of the comparator 66 so as to be compared with the previous value $S_1$. If $S_2$ is smaller than $S_1$, the comparator 66 delivers an output which drives the data transfer control circuit 68. Consequently, the data transfer control circuit 68 sends a transfer instruction signal to the register 62 to delete the value $S_1$ stored hitherto so that the value $S_2$ as a digital quantity produced through conversion by A/D converter 60 is stored instead in the register 62. If, on the other hand, $S_2$ is equal to or larger than $S_1$, the comparator 66 delivers no output so that the data transfer control circuit 68 does not deliver any transfer instruction signal. Accordingly, the value $S_1$ stored in the register 62 is not renewed. In like manner, the stored content of the register 62 is sequentially compared with the instantaneous values detected by the detector 22 and the content of the register 62 is always ready to be renewed whenever an instantaneous value arriving at the comparator 66 is smaller than the value stored in the register 62.

Thus, the minimum value of the field emission electron current in the form of an analog quantity produced through conversion by the D/A converter 64 is sent to the comparator 52 (FIG. 1), which compares the minimum value with the instantaneous value detected by the detector 22, so described previously with reference to FIG. 1.

As described above, according to this invention, the damage to the field emission electron source can be securely prevented. There is no need for an operator for monitoring the field emission electron current. The reliability of the electron producing apparatus of the field emission type is also improved. This invertion therefore has great industrial merit.

We claim:

1. An electron producing apparatus of the field emission type comprising:
    a source for producing electrons;
    an anode disposed opposite to said electron producing source;
    first means for applying a voltage to said electron producing source so as to cause said electron producing source to emit a field emission electron current toward said anode;
    second means for detecting the instantaneous value and the minimum value of the emitted electron current;
    third means for comparing said instantaneous value with said minimum value and for delivering an output signal when said instantaneous value assumes a predetermined magnitude relative to said minimum value; and
    fourth means for interrupting the field emission in response to said output signal of said third means.

2. An electron producing apparatus of the field emission type as claimed in claim 1, wherein said second means includes memory means which stores said minimum value in such a manner that the content of said memory means is always ready to be renewed.

3. An electron producing apparatus of the field emission type as claimed in claim 1, wherein said third means delivers an output when said instantaneous value assumes a value within a range of 1.2 to 2.0 times said minimum value.

4. An electron producing apparatus of the field emission type as claimed in claim 2, wherein said third means delivers an output when said instantaneous value assumes a value within 1.2 to 2.0 times said minimum value.

5. An electron producing apparatus of the field emission type as claimed in claim 2, wherein said second means detects as said field emission electron current the sum of the anode electron current flowing from said source to said anode and all the other electron current.

6. An electron producing apparatus of the field emission type as claimed in claim 3, wherein said second means detects as said field emission electron current the sum of the anode electron current flowing from said source to said anode and all the other electron current.

7. An electron producing apparatus of the field emission type as claimed in claim 4, wherein said second means detects as said field emission electron current the sum of the anode electron current flowing from said source to said anode and all the other electron current.

8. An electron producing apparatus of the field emission type as claimed in claim 3, wherein said second means detects as said field emission electron current the anode electron current flowing from said source to said anode.

9. An electron producing apparatus of the field emission type as claimed in claim 4, wherein said second means detects as said field emission electron current the anode electron current flowing from said source to said anode.

10. An electron producing apparatus of the field emission type comprising:

a source for producing electons;
an anode disposed opposite to said source;
a power supply for applying a voltage to said source so as to cause said electron producing source to emit a field emission electron current toward said anode;
a power supply controller for controlling said power supply;
a switching means for connecting said power supply with said power supply controller;
a detector for detecting the instantaneous value of said field emission electron current;
a memory means connected with said detector, for temporarily storing the minimum value of said field emission electron current;
a comparator connected with said detector and said memory means, for comparing said instantaneous value with said minimum value and for delivering an output signal when said instantaneous value assumes a predetermined magnitude relative to said minimum value; and
a switching means controller connected with said comparator, for opening said switching means in response to said output signal so as to deenergize said power supply.

* * * * *